United States Patent
McLaren

(12) 
(10) Patent No.: US 6,400,223 B1
(45) Date of Patent: Jun. 4, 2002

(54) DOUBLE CARRIER CANCELLATION IN WIDE BAND MULTI-CARRIER FEED FORWARD LINEARIZED POWER AMPLIFIER

(75) Inventor: Roy McLaren, Gustavsberg (SE)

(73) Assignee: Nokia Networks OY, Espoo (FI)

(*) Notice: Subject to any disclaimer, the term of this patent is extended or adjusted under 35 U.S.C. 154(b) by 0 days.

(21) Appl. No.: 09/592,611

(22) Filed: Jun. 12, 2000

(51) Int. Cl.[7] ................................................ H03F 1/26
(52) U.S. Cl. ...................................... 330/151; 330/149
(58) Field of Search ................................. 330/149, 151

(56) References Cited

U.S. PATENT DOCUMENTS 6,066,984 A * 5/2000 Tomaru et al. ......... 330/151 X
6,133,791 A * 10/2000 Horiguchi et al. .......... 330/151

\* cited by examiner

Primary Examiner—Steven J. Mottola
(74) Attorney, Agent, or Firm—Banner & Witcoff, Ltd.

(57) ABSTRACT

The quality and efficiency of producing an amplified signal output from a feed-forward amplifier system having reduced distortion and noise is provided. Multiple signal cancellation loops are included in the feed-forward amplifier system so as to more accurately adjust the different frequencies within a frequency band. The multiple signal cancellation loops improve carrier cancellation levels and reduce the size of the error amplifier needed in the distortion cancellation loop and/or multiple distortion cancellation loops to improve distortion cancellation and reduce the size of the main power amplifier.

39 Claims, 5 Drawing Sheets

US 6,400,223 B1

DOUBLE CARRIER CANCELLATION IN WIDE BAND MULTI-CARRIER FEED FORWARD LINEARIZED POWER AMPLIFIER

BACKGROUND OF THE INVENTION

1. Technical Field of the Invention

The present invention relates generally to electrical amplification, and more particularly to feed forward amplification.

2. Description of the Related Art

A feed-forward amplifier system was proposed by Harold S. Black in the 1920's as illustrated by his United States patent, U.S. Pat. No. 1,686,792, which is hereby incorporated by reference for all purposes. The feed-forward amplifier system design was intended to reduce amplifier distortion, e.g., inter-modulation distortion (IMD) of carrier signals (carriers) to thereby suppress cross-talk between multiple carriers. Since then various feed-forward amplifier system designs have been proposed for reducing amplifier distortion and noise. A number of examples of the various feed-forward amplifier designs are provided in U.S. Pat. No. 5,051,704 issued to Chapman et al., hereby incorporated by reference for all purposes. The feed-forward amplifier system is now well established and particularly useful in wideband and multi-carrier systems.

One particular example of a feed-forward amplifier system used for educing distortion and noise is provided in FIG. 1. There is shown a feed-forward amplifier system having two different carrier signals, carrier signal 101 and carrier signal 102 having two different frequencies that are input into to node 110 where they produce combined signal 103. Combined signal 103 is provided through node 111 to an amplifier 112 and an adjuster 113. The output of amplifier 112 is provided through node 115 to a delay element 117 and to node 116. The output of adjuster 113 is input to delay element 114 and output therefrom to node 116. Node 111, amplifier 112, node 115, node 116, adjuster 113, and delay element 114 make up a signal cancellation loop 140. As such, ideally the output of the signal cancellation loop 140 from node 116 has had the signal of the combined carrier signals, signal 103, removed and contains only the distortion and noise produced as a result of imperfect amplification and inter-modulation products of amplifier 112. However, in some applications, for example wideband and multi-carrier amplifier systems, the carrier signals are not completely cancelled in the signal cancellation loop 140, because of non-ideal frequency response (and matching) of the amplifier 112 (and other passive components).

The output of node 115 is input to delay element 117 and the output of delay element 117 is input to node 120. The output of node 116 is input to adjuster 118. The output of adjuster 118 is input to amplifier 119 which amplifies the adjusted distortion and noise component, introduced to the signal by amplifier 112. The output of amplifier 119 is input to node 120. Node 115, node 116, adjuster 118, amplifier 119, delay element 117, and node 120 make up distortion cancellation loop 150 which operates to remove the distortion and noise component from the output signal of amplifier 112 to thereby produce amplified signal 104 reasonably free of noise and distortion introduced by amplifier 112.

In operation, the feed-forward amplifier system of FIG. 1 operates to remove the distortion, e.g., IMD, and noise that would normally occur as a result of the non-ideal characteristics and inter-modulation products of amplifier 112. First, the distortion and noise generated by amplifier 112 is isolated in the signal cancellation loop by, for example, subtracting the source signal 103 from the amplified output of amplifier 112. This signal is output from node 116 and is often referred to as the error signal. Next, the error signal is adjusted by adjuster 118, amplified by amplifier 119, and then, for example, subtracted at node 120 from the delayed (via delay element 117) amplified output signal of amplifier 112 which contains distortion and noise introduced by amplifier 112. As a result, the signal 104 output from the feed-forward amplifier system is intended to have reduced distortion and noise.

However, for some applications amplifier designs are required to be very robust to achieve the distortion and noise reduction required. This is particularly true for wideband and multi-carrier applications such as cellular telephone communications. The known feed-forward amplifier system described above suffers from poor carrier cancellation in wide-band adaptive feed-forward amplifiers for multi-carrier operation. There are several ways to attempt to overcome this problem. First, an unnecessarily large error amplifier can be used to compensate for the poor carrier cancellation. The problem with this approach is that it leads to poor system efficiency. Another approach to alleviate this problem is to specify the required performance of active and passive components from manufacturers to fit within tight phase and gain flatness tolerances and that have very good matching. This approach, however, increases the unit price of the components and has limitations in terms of what can be achieved in practice. Finally, complex and more elaborate digital control circuitry can be used in order to provide high phase and gain control accuracy and resolution, but this approach also leads to increased costs with only marginal performance improvements.

SUMMARY OF THE INVENTION

The present invention is directed to improving the quality of the signal output from a feed-forward amplifier system and/or allowing for reduction of the distortion and noise that results from the electrical characteristics of the amplifiers used in a feed-forward amplifier system over wide bandwidths. The present invention uses multiple signal cancellation loops in a feed-forward amplifier system. The double carrier cancellation method and apparatus disclosed herein improve carrier cancellation levels and at the same time avoid the disadvantages described above. In addition, the double carrier cancellation method and apparatus leads to a reduction in the size of the error amplifier needed in the distortion cancellation loop thus leading to improved system efficiency.

According to one variation of the invention, two signal cancellation loops of a two carrier multi-carrier feed-forward amplifier system are provided, wherein each loop shares the same amplifier and each loop has a separate adjuster. The separate adjusters can be used to adjust different portions of a frequency band.

Other features and advantages of the invention will become apparent through the following description, the figures, and the claims.

BRIEF DESCRIPTION OF THE DRAWINGS

The foregoing summary of the invention as well as the following detailed description of the preferred embodiments is better understood when read in conjunction with the accompanying drawings, which are included by way of example, and not by way of limitation with respect to the claimed invention:

DESCRIPTION OF THE PREFERRED EMBODIMENTS

Figure 1:
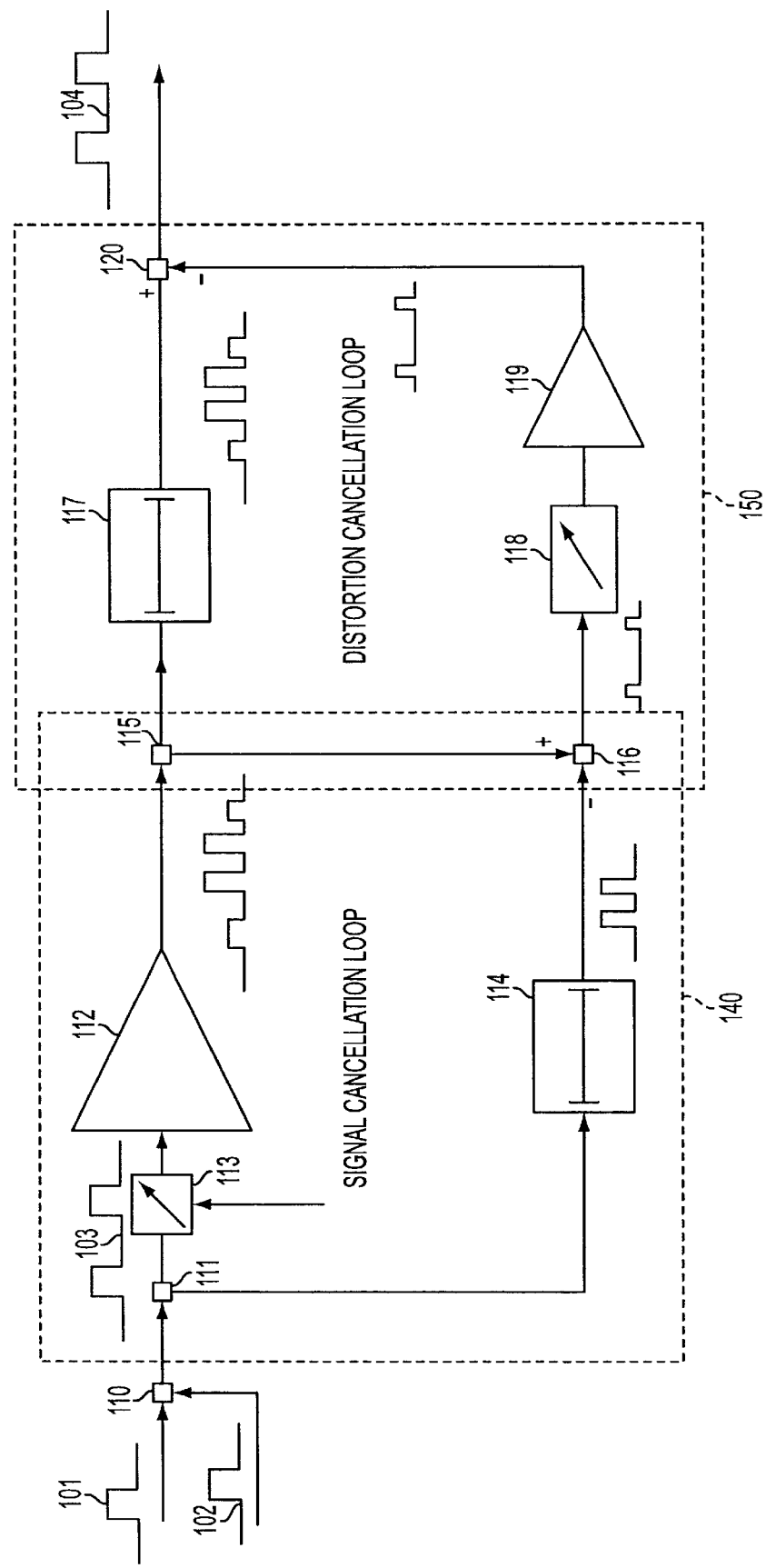
FIG. 1 illustrates a prior art feed-forward amplifier system.

The accuracy of matching the amplitude and phase response of the amplifier signal path and the delay element signal path in the signal cancellation loop of a feed-forward amplifier system in great part determines the extent to which the distortion and noise of the amplified signals may be reduced for a given auxiliary (error) amplifier. However, sufficient matching of the amplitude and phase response of the amplifier signal path and the delay element signal path in the signal cancellation loop is more difficult to achieve for broader bandwidth applications than in small frequency bandwidths because amplifiers generally have amplitude and phase response that varies non-linearly as a function of frequency and due to imperfect impedance matching of the passive components.

In the signal cancellation loop of a feed-forward amplifier the amplitude and phase responses of signals in the two separate paths (one path via the amplifier and one path via the delay element) should match one another in time delay and in antiphase over frequency as closely as possible so as to get good cancellation of the carrier(s). In the ideal situation the two paths will be matched leaving only the distortion and noise to be adjusted and amplified in the distortion cancellation loop of the feed-forward amplifier system. If the carrier(s) are not cancelled perfectly as a result of the amplitude and phase response of the two paths in the signal cancellation loop not matching, the power of the residual carrier(s) ("leaking" carrier(s)) will waste the power of the amplifier in the distortion cancellation loop. One of the limiting factors of feed-forward amplifier's ability to reduce distortion and noise from the output signal, is the maximum power that the amplifier in the distortion cancellation loop can deliver while operating linearly. Therefore, the more perfectly matched the amplitude and phase response of signals in the amplifier path and the delay path of the signal cancellation loop throughout the band of frequencies of the signals to be amplified, the more completely cancelled will be the carrier signal(s), and the less output power required from the amplifier of the distortion cancellation loop. The less power required from the amplifier of the distortion cancellation loop, the more linearly the distortion and noise signal is being amplified, and thus the more perfectly the distortion and noise signal can be subtracted from the output signal of the feed-forward amplifier system, and the better the performance and efficiency of the system.

As alluded to above, sufficient cancellation can be achieved more easily for a small frequency band. It becomes increasingly more difficult to match the amplitude and phase response of the two signal paths in the signal cancellation loop as the bandwidth of the application increases. This is mainly due to non-ideal (non-linear as a function of frequency) amplitude and phase responses of the amplifier in the signal cancellation loop. In single carrier amplifiers sufficient matching may be achieved with careful amplifier design, but with multi-carrier amplifiers this becomes a problem because of the wider bandwidth.

The present invention uses multiple signal cancellation loops of a feed-forward amplifier system, wherein each loop has an adjuster so as to be able to more accurately adjust the different frequencies within a frequency band.

A few detailed embodiments of the invention are provided below to more clearly explain certain aspects of the invention. However, one skilled in the art will recognize that these embodiments are intended to be exemplary and the invention is not limited merely to these detail examples.

Figure 2:
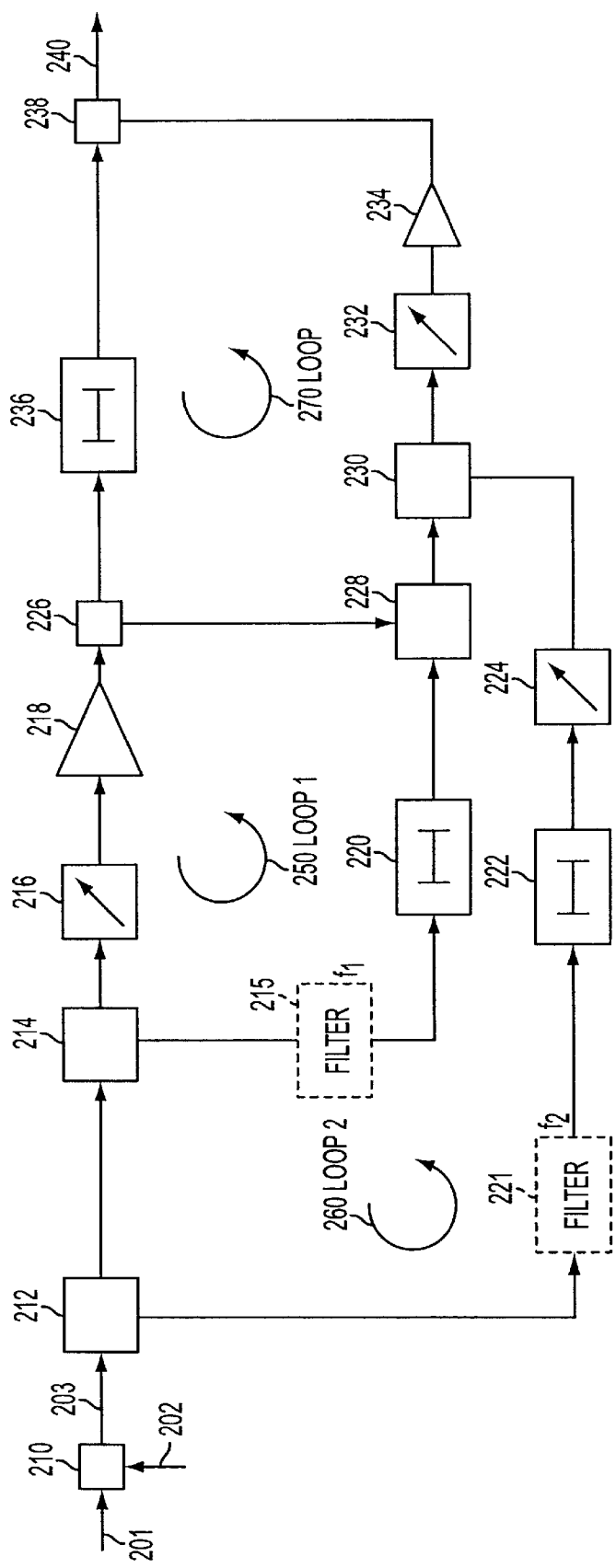
FIG. 2 illustrates a first embodiment of a feed-forward amplifier system, according to the invention.

A first exemplary embodiment of the present invention feed-forward amplifier system with two signal cancellation loops is provided in FIG. 2. There is shown a feed-forward amplifier system having two different carrier signals, a first carrier signal 201 and a second carrier signal 202 having two different frequencies that are input into a node 210 where they produce a combined signal 203. The combined signal 203 is provided to a node or coupler 212, for example, a splitter or divider, which sends the combined signal into the first and second signal cancellation loops 250 and 260. The combined signal is provided through a node or coupler 214 to an adjuster 216 and a delay element 220. The adjuster 216 may comprise, for example, separate amplitude and phase adjusters, a vector regulator or an IQ-modulator which is designed to accurately adjust the phase and amplitude expected for the combined signal 203. The output of the adjuster 216 is provided to an amplifier 218, for example, a main amplifier. The output of the amplifier 218 is provided through a node 226 to a delay element 236 and to a node 228. Nodes 212, 214, and 226 may be a direct electrical connection or a coupler, e.g., a directional coupler, a directional splitter, a hybrid coupler, etc. The combined signal 203 is inputted into the delay element 220, for example, a delay line and output therefrom to the node 228. The node 212, node 214, adjuster 216, amplifier 218, delay 220, node 226 and node 228 make up the first signal cancellation loop 250.

As noted above, the combined signal 203 is also provided to the second signal cancellation loop 260 through the node 212. The combined signal is outputted from node 212 to a delay element 222, for example, a delay line. The output of the delay line 222 is provided to an adjuster 224. The adjuster 224 may comprise, for example, separate amplitude and phase adjusters, vector regulator, or an IQ-modulator which is designed to accurately adjust the phase and amplitude expected for the combined signal 203. The output of the adjuster 224 is combined in a coupler 230, for example, a combiner, with the signal from node 228 to form an error signal. The node 212, node 214, adjuster 216, amplifier 218 node 226, node 228, delay element 222, adjuster 224 and coupler 230 make up the second signal cancellation loop.

The distortion cancellation loop of the feed-forward amplifier system for this embodiment of the invention comprises an auxiliary amplifier for amplifying the error signal output from the node 230 which is combined with the combined carrier signal 203 amplified by the main amplifier 218 so as to remove the distortion and noise introduced into the signal as a result of the non-linear characteristics of the main amplifier 218. The output of the node 226 is input to the delay element 236, for example, a delay line and output therefrom to a coupler 238. The output of the coupler 230 is input to an adjuster 232. The adjuster 232 is, for example, an amplitude and phase adjuster, a vector regulator or an IQ-modulator. The output of the adjuster 232 is input to an amplifier 234, for example, an auxiliary (error) amplifier which amplifies the adjusted distortion and noise component of the signal amplified by the amplifier 218. The output of the amplifier 234 is input to the coupler 238. The coupler 238 may be a directional coupler and may be made to add or subtract. The node 226, node 228, node 230, adjuster 232, amplifier 234, delay element 236 and the coupler 238 make up the distortion cancellation loop 270 which operates to remove the distortion and noise component from the output signal of the amplifier 218 to produce an amplified signal 240 which has improved reduction of distortion and noise.

In operation, the feed-forward amplifier system operates to remove the distortion, e.g., IMD, and noise that would normally occur as a result of the non-ideal characteristics and intermodulation products of the amplifier 218 operating alone. First the distortion and noise generated by the amplifier 218 is isolated in the signal cancellation loop 250 and the signal cancellation loop 260 by, for example, subtracting the combined carrier signal 203 from the output of the amplifier 218 (including distortion and noise) to produce an error signal. This error signal is output from the coupler 230. In various embodiments of the invention, the adjusters in each signal cancellation loop can adjust the same or different sections of the wanted frequency band of the combined carrier signal 203, so that the error signal output from the coupler 230 has improved reduction in the amount of residual carrier signal components in the error signal so that the signal output from the coupler 230 is more closely pure distortion and noise. For example, a filter 221 can be placed in the second signal cancellation loop so as to filter the combined carrier signal prior to being inputted into the adjuster 224. In addition, a filter 215 can be placed in the first signal cancellation loop so as to filter the combined signals prior to being imputed into the delay 220. Filters can also be used to in part or completely remove the delays 220 and 222. Next, the error signal output from the coupler 230 is adjusted by the adjuster 232, amplified by the amplifier 234, and then, for example, subtracted at coupler 238 from the delayed (via delay element 236) amplified output signal of the amplifier 218 which contains distortion and noise. As a result, the signal 240 output from the feed-forward amplifier system has an improved reduction of the distortion and noise.

For multi-carrier operation and over large bandwidths, for example, in excess of 15 MHz, it is difficult to achieve satisfactory levels of carrier cancellation due to tough requirements on loop phase and gain balance and phase and gain ripple over the bandwidth. Poor carrier cancellation (less than 30 dB) leads to an unnecessarily large error amplifier which results in poor system efficiency. In addition, poor carrier cancellation leads to tougher requirements on error amplifier linearity. This embodiment of the invention uses the second feed-forward carrier cancellation loop to enhance carrier cancellation over the entire bandwidth. As noted above, the two signal cancellation loops share the same main amplifier branch. In the first carrier cancellation loop, the phase and gain of the main power amplifier 218 are controlled by controlling the adjuster 216 in order to provide cancellation over the bandwidth. The function of the second signal cancellation loop is similar to that of the first signal cancellation loop. In the second signal cancellation loop, the phase and gain imbalance is controlled by the adjuster 224. In one embodiment of the invention, the two signal cancellation loops are used to enhance carrier cancellation over different sections of the carrier bandwidth. For example, the adjuster 216 can be optimized to achieve optimal cancellation in the upper section of the wanted frequency band, e.g., the upper carrier, while the adjuster 224 can be optimized to achieve optimal cancellation in the lower section of the wanted frequency band, e.g., the lower carrier, or vice versa.

Figure 3:
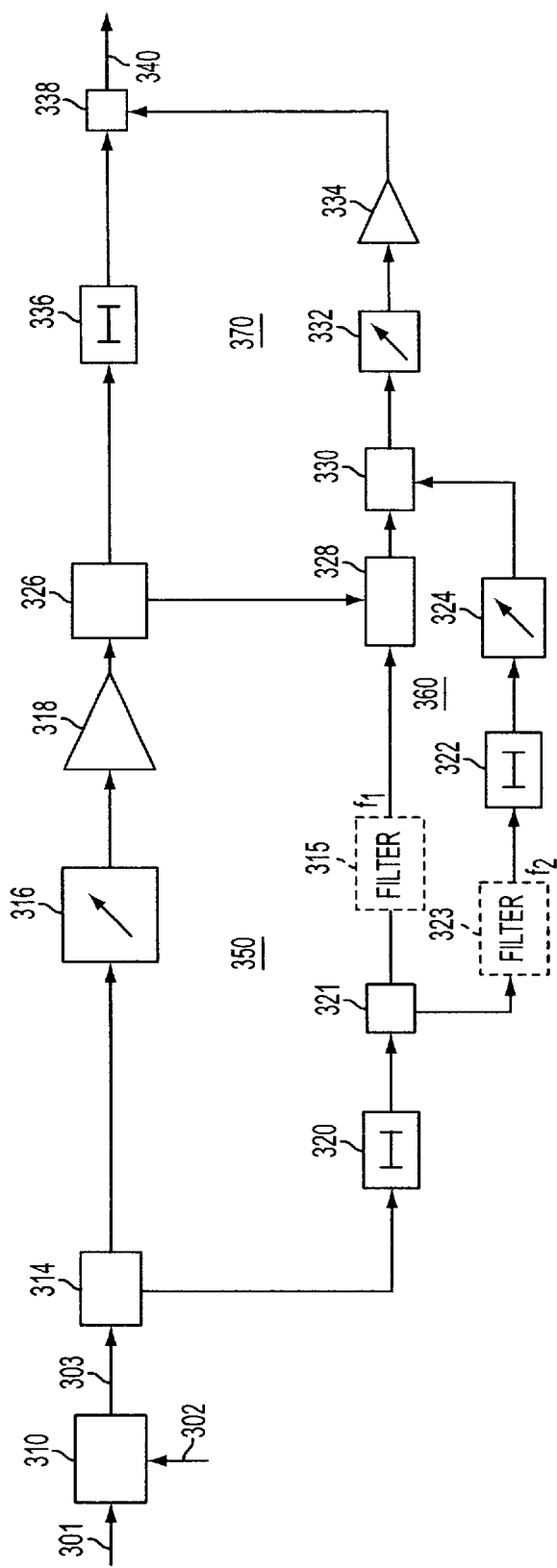
FIG. 3 illustrates a second embodiment of a feed-forward amplifier system, according to the invention.

A second exemplary embodiment of the present invention feed-forward amplifier system with two signal cancellation loops is provided in FIG. 3. In this embodiment of the invention, the need for a delay element in the second signal cancellation loop can be eliminated altogether due to this circuit design. There is shown a feed-forward amplifier system having two different carrier signals, a first carrier signal 301 and a second carrier signal 302 having two different frequencies that are input into a node 310 where they produce a combined signal 303. The combined signal 303 is provided to a node or coupler 314, for example, a splitter or divider, which sends the combined signal into the first and second signal cancellation loops 350 and 360. The combined signal is provided to an adjuster 316 and a delay element 320. The adjuster 316 may comprise, for.example, separate amplitude and phase adjusters, a vector regulator or an IQ-modulator which is designed to accurately adjust the phase and amplitude expected for the combined signal 303. The output of the adjuster 316 is provided to an amplifier 318, for example, a main amplifier. The output of the amplifier 318 is provided through a node 326 to a delay element 336 and to a node 328. Nodes 314 and 326 may be a direct electrical connection or a coupler, e.g., a directional coupler, a directional splitter, a hybrid coupler, etc. The combined signal 303 is inputted into the delay element 320, for example, a delay line and output therefrom to a node 321 and then to the node 328. The node 314, adjuster 316, amplifier 318, delay 320, node 321, node 326 and node 328 make up the first signal cancellation loop 350.

As noted above, the combined signal 303 is also provided to the second signal cancellation loop 360 through the node 314. The combined signal is outputted from node 314 to the delay element 320. The output of the delay line 320 is provided to the node 321 and then to a second delay 322. The output of the delay line 322 is provided to an adjuster 324. The adjuster 324 may comprise, for example, separate amplitude and phase adjuster, a vector regulator, or an IQ-modulator which is designed to accurately adjust the phase and amplitude expected for the combined signal 303. The output of the adjuster 324 is combined in a coupler 330, for example, a combiner, with the signal from node 328 to form an error signal. The node 314, adjuster 316, amplifier 318 node 326, node 321, node 328, delay elements 320 and 322, adjuster 324 and coupler 330 make up the second signal cancellation loop 360.

The distortion cancellation loop of the feed-forward amplifier system for this embodiment of the invention comprises an auxiliary amplifier for amplifying the error signal output from the node 330 which is combined with the combined carrier signal 303 amplified by the main amplifier 318 so as to remove the distortion and noise introduced into the signal as a result of the non-linear characteristics of the main amplifier 318. The output of the node 326 is input to the delay element 336, for example, a delay line and output therefrom to a coupler 338. The output of the coupler 330 is input to an adjuster 332. The adjuster 332 is, for example, an amplitude and phase adjuster, a vector regulator or an IQ-modulator. The output of the adjuster 332 is input to an amplifier 334, for example, an auxiliary (error) amplifier which amplifies the adjusted distortion and noise component of the signal amplified by the amplifier 318. The output of the amplifier 334 is input to the coupler 338. The coupler 338 may be a directional coupler and may be made to add or subtract. The node 326, node 328, node 330, adjuster 332, amplifier 334, delay element 336 and the coupler 338 make up the distortion cancellation loop 370 which operates to remove the distortion and noise component from the output signal of the amplifier 318 to produce an amplified signal 340 which has improved reduction of distortion and noise.

In operation, the feed-forward amplifier system operates to remove the distortion, e.g., IMD, and noise that would normally occur as a result of the non-ideal characteristics and inter-modulation products of the amplifier 318 operating alone. First the distortion and noise generated by the amplifier 318 is isolated in the signal cancellation loop 350 and the signal cancellation loop 360 by, for example, subtracting the combined carrier signal 303 from the output of the amplifier 318 (including distortion and noise) to produce an error signal. This error signal is output from the coupler 330. In various embodiments of the invention, the adjusters in each signal cancellation loop can adjust the same or different sections of the wanted frequency band of the combined carrier signal 303, so that the error signal output from the coupler 330 has improved reduction in the amount of residual carrier signal components in the error signal so that the signal output from the coupler 330 is more closely pure distortion and noise. For example, a filter 323 can be placed in the second signal cancellation loop so as to filter the combined carrier signal prior to being inputted into the adjuster 324. In addition, a filter 315 can be placed in the first signal cancellation loop so as to filter the combined signals prior to being inputted into the node 328. Filters can be used to in part or completely remove the delay 320. Next, the error signal output from the coupler 330 is adjusted by the adjuster 332, amplified by the amplifier 334, and then, for example, subtracted at coupler 338 from the delayed (via delay element 336) amplified output signal of the amplifier 318 which contains carrier distortion and noise. As a result, the signal 340 output from the feedforward amplifier system has an improved reduction of the distortion and noise.

Figure 4:
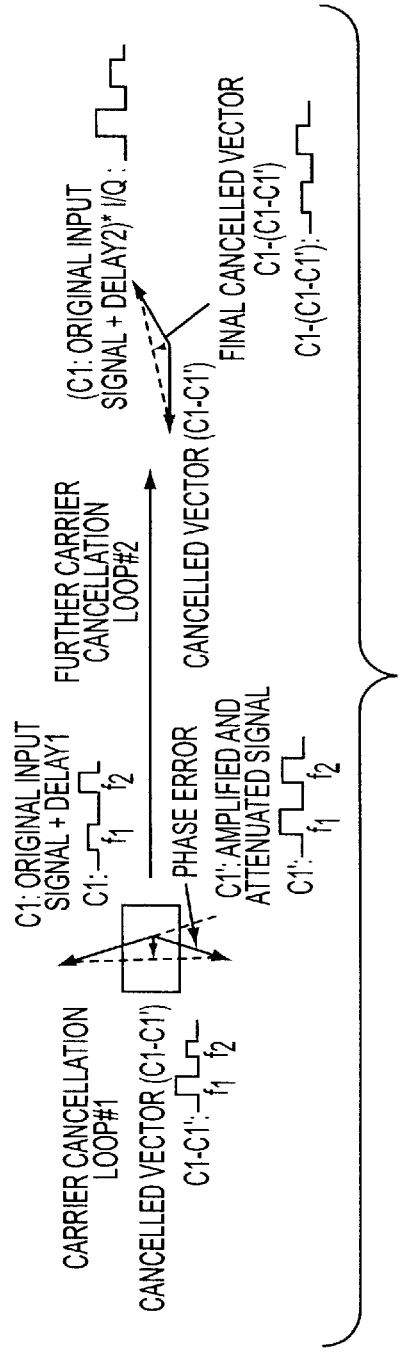
FIG. 4 illustrates a vector and frequency domain representation of the cancellation in the signal cancellation loops according to one embodiment of the invention, wherein distortion from the amplifier is not illustrated for clarity.

As illustrated in FIG. 4, the adjuster for the second signal cancellation loop may have to be designed to track the amplitude and phase of the resultant cancelled vector after the first loop cancellation (C1–C1') due to the varying phase and amplitude error associated with the first loop carrier cancellation. The amplitude and phase of vector C1–C1' varies over time and frequency. In this embodiment, C1 in the second loop is continuously adjusted to be amplitude and anti-phase matched to C1–C1' which is accomplished by the adjuster in the second loop. The setting of the adjuster 324 is dependent on the setting of the adjuster 316.

Figure 5:
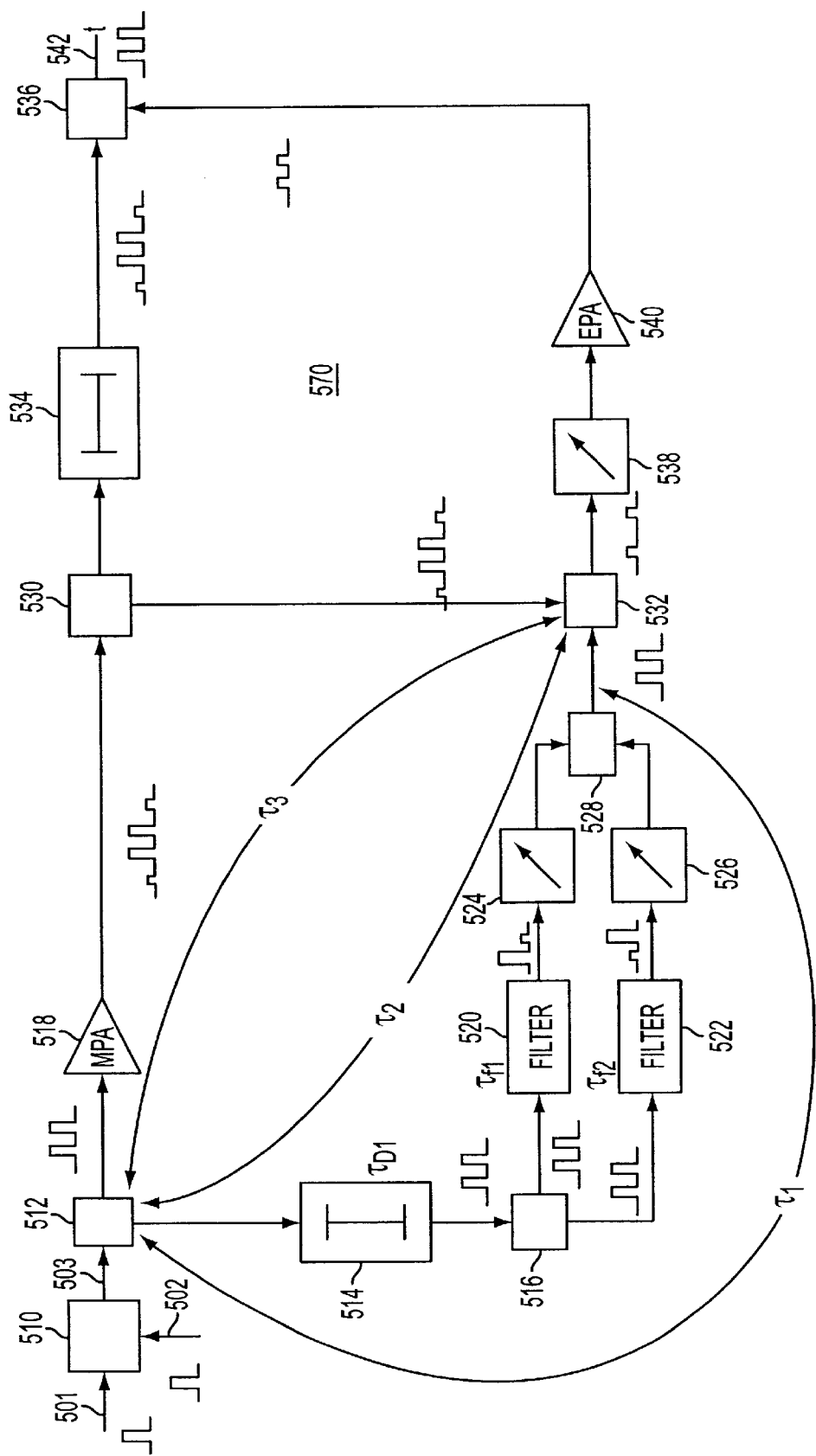
FIG. 5 illustrates another embodiment of a feed-forward amplifier system according to the invention.

A further embodiment of this invention is illustrated in FIG. 5 and allows for the adjusters to be set independently from each other. Thus, FIG. 5 illustrates an embodiment of the invention which can be used to alleviate the phase and gain tracking of the cancelled signal. There is shown a feed-forward amplifier system having two different carrier signals, a first carrier signal 501 and a second carrier signal 502 having two different frequencies that are input into a node 510 where they produce a combined signal 503. The combined signal 503 is provided to a node or coupler 512, for example, a splitter or divider. The combined signal is provided to an amplifier 518 and a delay element 514. The output of the amplifier 518 is provided through a node 530 to a delay element 534 and to a node 536. Nodes 512 and 530 may be a direct electrical connection or a coupler, e.g., a directional coupler, a directional splitter, a hybrid coupler, etc. The combined signal 503 is also inputted into the delay element 514, for example, a delay line and output therefrom to the node 516. The delayed signal supplied to the node 516 is provided to a filter 520 and a filter 522. The filtered signals are then output from the filters 520 and 522 to an adjuster 524 and an adjuster 526, respectively. The adjuster 524 and 526 may comprise, for example, separate amplitude and phase adjusters, a vector regulator or an IQ-modulator which is designed to accurately adjust the phase and amplitude expected for the combined signal 503.. The adjusted signals are then combined in node 528. This combined signal is then combined with the output of the amplifier in node 532 so as to remove the distortion and noise introduced into the signal as a result of non-linear characteristics of the main amplifier 518.

The output of the coupler 532 is input to an adjuster 538. The adjuster 538 is, for example, an amplitude and phase adjuster, a vector regulator or an IQ-modulator. The output of the adjuster 538 is input to an amplifier 540, for example, an auxiliary (error) amplifier which amplifies the adjusted distortion and noise component of the signal amplified by the amplifier 518. The output of the amplifier 540 is input to the coupler 536. The coupler 530 may be a directional coupler and may be made to add or subtract. The node 530, node 532, adjuster 538, amplifier 540, delay element 534 and the coupler 536 make up the distortion cancellation loop 570 which operates to remove the distortion and noise component from the output signal of the amplifier 518 to produce an amplified signal 542 which has improved reduction of distortion and noise.

Figure 6:
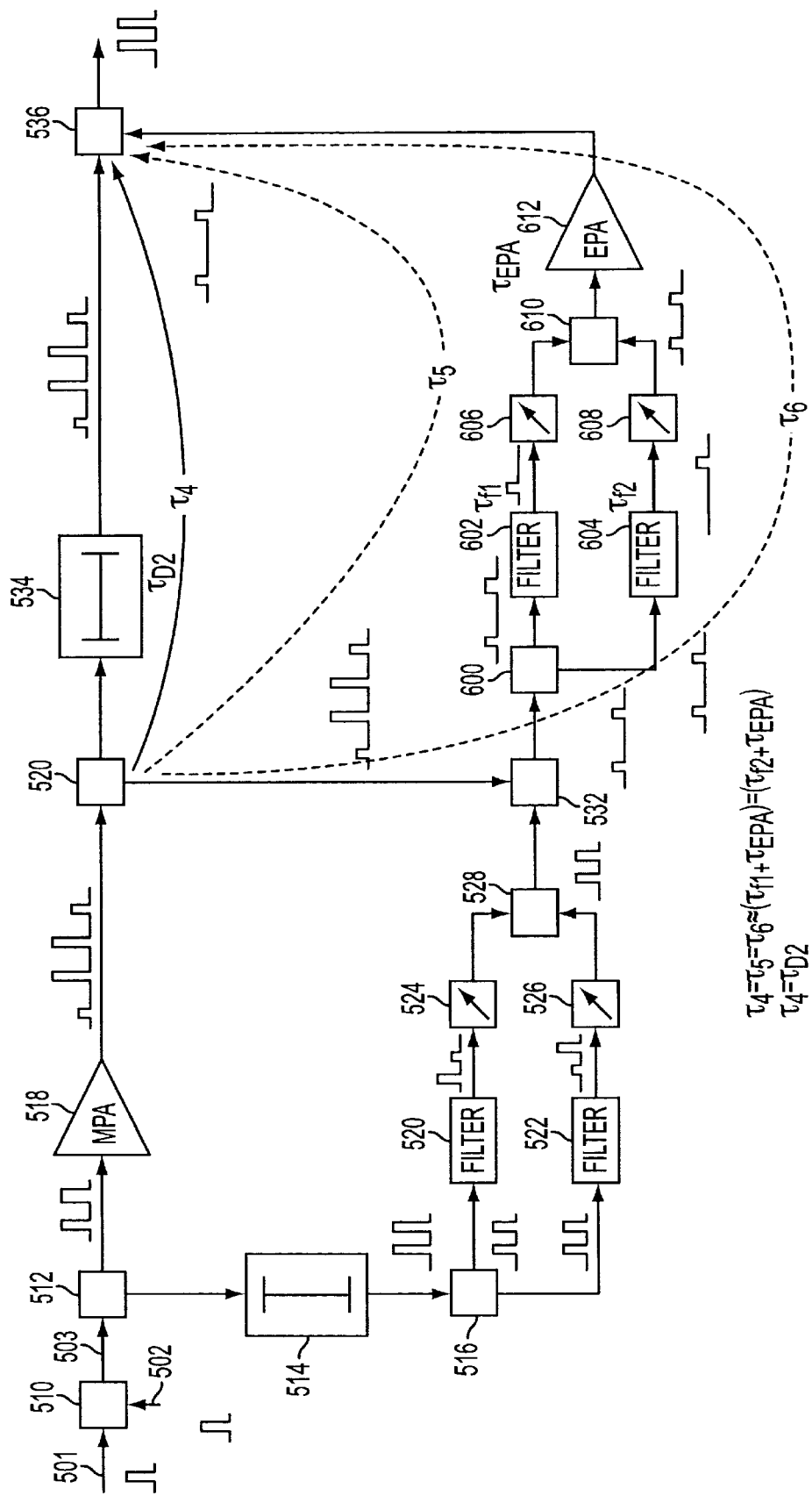
FIG. 6 illustrates another embodiment of a feed-forward amplifier system according to the invention.

FIG. 6 extends the double loop principle to both the carrier cancellation and the distortion cancellation loops. In FIG. 6, the principle is identical in both loops, but will offer both improved carrier and distortion cancellation over wide bandwidths. The embodiment illustrated in FIG. 6 has the same advantages as the other embodiments, but will, in addition, lead to relaxed linearity requirements for the main power amplifier and/or reduce the required size and thereby power consumption of the main power amplifier. It is worth noting that the embodiment illustrated in FIG. 6 will force the use of a high delay $\tau D2$ due to the filter elements being in the opposite branch so this embodiment might best be used for lower power applications, but is not limited thereto.

The carrier cancellation loops of FIG. 6 are the same as in FIG. 5 so the individual elements have been give the same reference numerals and will not be described. In FIG. 6, the combined signal from node 532 is provided to a node 600, which provides the signal to a filter 602 and a filter 604. The filtered signals are then provided to adjusters 606 and 608, respectively. The signals outputted from the adjusters 606 and 608 are then combined in node 610 and then provided to an amplifier 612, for example, an auxiliary (error) amplifier which amplifies the adjusted distortion and noise component of the signal amplified by the amplifier 518. The output of the amplifier is input into the coupler 536.

Although particular embodiments of the present invention have been shown and described, it will be understood that it is not intended to limit the invention to the preferred embodiments and it will be obvious to those skilled in the art that various changes and modifications may be made without departing from the spirit and scope of the present invention. Thus, the invention is intended to cover alternatives, modifications, and equivalents, which may be included within the spirit and scope of the invention as defined by the claims. For example, the present invention is applicable to any application in which improved distortion and noise reduction would occur as a result of adding multiple adjusters, directed to a portion of the amplified signal frequency band, to an amplifier system. Further, if the invention is used with RF frequency signals, all nodes may be directional couplers or other types of dividers/combiners.

All publications, patents, and patent applications cited herein are hereby incorporated by reference in their entirety for all purposes.

What is claimed is:

1. An amplifier system, comprising:
    an amplifier;
    a first adjuster located in a first signal cancellation loop with said amplifier for adjusting a first portion of a frequency band; and
    a second adjuster located in a second signal cancellation loop with said amplifier for adjusting a second portion of said frequency band,
    wherein said first signal cancellation loop and said second signal cancellation loop isolate distortion and noise produced by said amplifier to produce an error signal.

2. The amplifier system of claim 1, wherein said first adjuster is an amplitude and phase adjuster.

3. The amplifier system of claim 2, wherein said second adjuster is an amplitude and phase adjuster.

4. The amplifier system of claim 1, wherein the output of said first adjuster is input to the amplifier.

5. An amplifier system, comprising:
    an amplifier;
    a first adjuster located in a first signal cancellation loop with said amplifier for adjusting a first portion of a frequency bond.

6. The amplifier system of claim 4, further comprising:
    a delay element;
    wherein an input to said first adjuster is input to said delay element; and
    wherein an output of said delay element is input to said second adjuster.

7. The amplifier system of claim 4, further comprising:
    a first filter for filtering a portion of the frequency band of the first signal cancellation loop;
    a second filter for filtering a portion of the frequency band of the second signal cancellation loop.

8. The amplifier system of claim 1, wherein said amplifier system is a feed forward amplifier system and said first adjuster adjusts a frequency of a combined carrier signal and said second adjuster adjusts a frequency of at least a portion of the combined carrier signal.

9. The amplifier system of claim 1, wherein said first signal cancellation loop cancels a first carrier component and noise component which exists at an output of said amplifier and said second signal cancellation loop cancels a second carrier component and noise component which exists at the output of said amplifier.

10. The amplifier system of claim 1, wherein said first signal cancellation loop cancels a first carrier component and noise component which exists at an output of said amplifier and said second signal cancellation loop cancels a residual carrier component and noise component which exists after the first noise component has been cancelled.

11. A feed-forward amplifier system, comprising:
    a first signal cancellation loop;
    a second signal cancellation loop;
    a distortion cancellation loop; and
    wherein said first signal cancellation loop and said second signal cancellation loop isolate distortion and noise produced by said amplifier to produce an error signal,
    wherein the first and second signal cancellation loops share an amplifier and each of the first and second cancellation loops has at least one adjusted for a different portion of a frequency bond; and
    wherein outputs of said first signal cancellation loop and said second cancellation loop are inputs to said distortion cancellation loop.

12. The feed-forward amplifier system of claim 11, further comprising: a delay element in each signal cancellation loop.

13. A feed-forward amplifier system, comprising:
    a first signal cancellation loop;
    a second signal cancellation loop;
    a distortion cancellation loop; and
    wherein said first signal cancellation loop and said second signal cancellation loop isolate distortion and noise produced by said amplifier to produce an error signal,
    wherein the first and second signal cancellation loops share an amplifier and each of said first and second cancellation loops has at least one adjuster
    wherein a first adjuster is located in said first signal cancellation loop for adjusting a first portion of a frequency band and a second adjuster is located in said second signal cancellation loop for adjusting a second portion of said frequency band so as to minimize any residual of carrier signals at the output of said first and second signal cancellation loops.

14. The feed-forward amplifier system of claim 11, wherein said first signal cancellation loop cancels a first noise component which exists at an output of said amplifier and said second signal cancellation loop cancels a second noise component which exists at the output of said amplifier.

15. The amplifier system of claim 1, wherein said first signal cancellation loop cancels a first noise component which exists at an output of said amplifier and said second signal cancellation loop cancels a residual noise component which exists after the first noise component has been cancelled.

16. A method for amplifying a signal, comprising the steps of:
    providing a first signal cancellation loop with an amplifier;
    providing said amplifier in a second signal cancellation loop with said amplifier;
    adjusting a signal in a first portion of a frequency band with a first adjuster located in said first signal cancellation loop; and
    adjusting a signal in a second portion of said frequency band with a second adjuster located in said second signal cancellation loop,
    wherein said first signal cancellation loop and said second signal cancellation loop isolate distortion and noise produced by said amplifier to produce an error signal.

17. The method of claim 16, further including the step of:
    adjusting amplitude and phase of said signal in said first portion of said frequency band and said signal in a second portion of said frequency band so as to sufficiently minimize the residual of a carrier signal at the output of said signal cancellation loop.

18. The method of claim 16, wherein said adjusting steps adjust amplitude and phase of said signal automatically.

19. The method of claim 16, wherein said first signal cancellation loop cancels a first noise component which exists at an output of said amplifier and said second signal cancellation loop cancels a second noise component which exists at the output of said amplifier.

20. The amplifier system of claim 16, wherein said first signal cancellation loop cancels a first noise component which exists at an output of said amplifier and said second signal cancellation loop cancels a residual noise component which exists after the first noise component has been cancelled.

21. A wireless telecommunication transmitter with a feed-forward amplifier system, comprising:
   a first signal cancellation loop with an amplifier and a first adjuster for a first portion of a frequency bond;
   a second signal cancellation loop with said amplifier and a second adjusted; for a second portion of a frequency band; and
   a distortion cancellation loop,
   wherein said first signal cancellation loop and said second signal cancellation loops isolate distortion and noise produced by said amplifier to produce an error signal, said distortion cancellation loop receiving an output of said amplifier and said error signal from said first and second signal cancellation loops as inputs.

22. The wireless telecommunication transmitter with a feed-forward amplifier system of claim 21, wherein said first and second adjusters are amplitude and phase adjusters.

23. A wireless telecommunication transmitter with a feed-forward amplifier system, comprising:
   a first signal cancellation loop with an amplifier and a first adjuster;
   a second signal cancellation loop with said amplifier and a second adjuster; and
   a distortion cancellation loop, wherein said first signal cancellation loop and said second signal cancellation loops isolate distortion and noise produced by said amplifier to produce an error signal, said distortion cancellation loop receiving an output of said amplifier and said error signal as inputs,
   wherein said first adjuster located in said first signal cancellation loop adjusts a first portion of a frequency band and said second adjuster located in said second signal cancellation loop adjusts a second portion of said frequency band.

24. The wireless telecommunication transmitter with a feed-forward amplifier system of claim 21, wherein said first signal cancellation loop cancels a first noise component which exists at an output of said amplifier and said second signal cancellation loop cancels a second noise component which exists at the output of said amplifier.

25. The wireless telecommunication transmitter with a feed-forward amplifier system of claim 21, wherein said first signal cancellation loop cancels a first noise component which exists at an output of said amplifier and said second signal cancellation loop cancels a residual noise component which exists after the first noise component has been cancelled.

26. The wireless telecommunication transmitter with a feed-forward amplifier system of claim 21, wherein a combined signal is input to said amplifier and a delay element.

27. A wireless telecommunication transmitter with a feed-forward amplifier system, comprising:
   a first signal cancellation loop with an amplifier and a first adjuster;
   a second signal cancellation loop with said amplifier and a second adjuster;
   a distortion cancellation loop,
   a first filter in said first cancellation loop for filtering a delayed signal output from said delay element; and
   a second filter in said second cancellation loop for filtering said delayed signal output from said delay element,
   wherein said first signal cancellation loop and said second signal cancellation loop isolate distortion and noise produced by said amplifier to produce an error signal, said distortion cancellation loop receiving an output of said amplifier and said error signal as inputs,
   wherein a combined signal is input to said amplifier and a delay element.

28. The wireless telecommunication transmitter with a feed-forward amplifier system of claim 27, wherein a first filtered signal output from said first filter is input to said first adjuster and a second filtered signal output from said second filter is input to said second adjuster.

29. The wireless telecommunication transmitter with a feed-forward amplifier system of claim 28, further comprising:
   means for combining output signals from said first adjuster with output signals from said second adjuster to produce a first combined signal.

30. The wireless telecommunication transmitter with a feed-forward amplifier system of claim 29, further comprising:
   means for combining signals output from said amplifier with said first combined signal to produce a second combined signal.

31. A wireless telecommunication transmitter with a feed-forward amplifier system, comprising:
   a first signal cancellation loop with an amplifier and a first adjuster;
   a second signal cancellation loop with said amplifier and a second adjuster;
   a distortion cancellation loop,
   wherein a combined input signal is input to said amplifier and a delay element,
   a first filter in said first cancellation loop for filtering a delayed signal output from said delay element;
   a second filter in said second cancellation loop for filtering said delayed signal output from said delay element, and
   means for combining an output signal from said first adjuster with an output signal from said second adjuster to produce a first combined signal,
   wherein a first filtered signal output from said first filter is input to said first adjuster and a second filtered signal output from said second filter is input to said second adjuster,
   means for combining signals output from said amplifier with said first combined signal to produce a second combined signal,
   wherein said distortion cancellation loop comprises:
   means for providing said second combined signal to third and fourth filters;
   said third and fourth filters filter said second combined signal;
   a third adjuster for adjusting a signal output from said third filter;
   a fourth adjuster for adjusting a signal output from said fourth filter;
   means for combining signals output from said third and fourth adjusters to produce a third combined signal; and
   an error amplifier for amplifying said third combined signal.

32. The amplifier system of claim 1, wherein a combined signal is input to said amplifier and a delay element.

33. The amplifier system of claim 32, further comprising:
a first filter in said first cancellation loop for filtering a delayed signal output from said delay element;
a second filter in said second cancellation loop for filtering said delayed signal output from said delay element.

34. The amplifier system of claim 33, wherein a first filtered signal output from said first filter is input to said first adjuster and a second filtered signal output from said second filter is input to said second adjuster.

35. The amplifier system of claim 34, further comprising:
means for combining output signals from said first adjuster with output signals from said second adjuster to produce a first combined signal.

36. The amplifier system of claim 35, further comprising:
means for combining signals output from said amplifier with said first combined signal to produce a second combined signal.

37. A wireless telecommunication transmitter with a feed-forward amplifier system, comprising:
a first signal cancellation loop with an amplifier and a first adjuster;
a second signal cancellation loop with said amplifier and a second adjuster; and
a distortion cancellation loop;
a first delay element in said first signal cancellation loop, wherein an input to said first adjuster is input to said first delay element; and
a second delay element in said second signal cancellation loop, wherein the input to said first adjuster is input to said second delay element and an output of said second delay element is input to said second adjuster;
wherein an input signal is directly connect to said amplifier.

38. A wireless telecommunication transmitter with a feed-forward amplifier system, comprising:
a first signal cancellation loop with an amplifier and a first adjuster;
a second signal cancellation loop with said amplifier and a second adjuster;
a plurality of distortion cancellation loops;
wherein said first signal cancellation loop and said second signal cancellation loops isolate distortion and noise produced by said amplifier to produce an error signal.

39. A wireless telecommunication transmitter with a feed-forward amplifier system, comprising:
a first signal cancellation loop with an amplifier and a first adjuster;
a second signal cancellation loop with said amplifier and a second adjuster;
a plurality of distortion cancellation loops;
a first delay element in said first signal cancellation loop, wherein an input to said first adjuster is input to said first delay element; and
a second delay element in said second signal cancellation loop, wherein the input to said first adjuster is input to said second delay element and an output of said second delay element is input to said second adjuster;
wherein said first signal cancellation loop and said second signal cancellation loop isolate distortion and noise produced by said amplifier to produce an error signal.

* * * * *